United States Patent

Walther

[11] Patent Number: 5,972,436
[45] Date of Patent: Oct. 26, 1999

[54] CVD PROCESS FOR COATING THE INSIDE OF HOLLOW BODIES

[75] Inventor: Marten Walther, Engelstadt, Germany

[73] Assignee: Schott Glaswerke, Mainz, Germany

[21] Appl. No.: 08/899,603

[22] Filed: Jul. 24, 1997

[30] Foreign Application Priority Data

Jul. 24, 1996 [DE] Germany .......................... 196 29 877

[51] Int. Cl.[6] .............................. C23C 16/52; C23C 7/22; B05D 3/06

[52] U.S. Cl. ......................... 427/535; 427/539; 427/237; 427/238; 427/8; 427/575

[58] Field of Search ...................... 427/535, 539, 427/569, 575, 578, 579, 576, 237, 238, 8

[56] References Cited

U.S. PATENT DOCUMENTS

| | | |
|---|---|---|
| 4,888,199 | 12/1989 | Felts et al. . |
| 5,154,943 | 10/1992 | Etzkorn .................................. 427/569 |
| 5,236,511 | 8/1993 | Etzkorn et al. . |
| 5,308,650 | 5/1994 | Krummel et al. . |

FOREIGN PATENT DOCUMENTS

| | | |
|---|---|---|
| 299752 | 1/1989 | European Pat. Off. . |
| 38 30 622 | 3/1990 | Germany . |
| 4008405 | 3/1990 | Germany . |
| 4122452 | 1/1993 | Germany . |

*Primary Examiner*—Roy V. King
*Attorney, Agent, or Firm*—Millen, White, Zelane, & Branigan, P.C.

[57] ABSTRACT

A process for CVD coating of a hollow body with a barrier layer, comprising measuring the temperature inside of the body by igniting plasma within said body with at least one ignition pulse and correlating the time between the ignition pulse and a pulse of light given off by plasma ignition, and a device for carrying out such a process.

19 Claims, 4 Drawing Sheets

CVD PROCESS FOR COATING THE INSIDE OF HOLLOW BODIES

BACKGROUND OF THE INVENTION

The invention relates to a chemical vapor deposition (CVD) process for coating the insides of hollow bodies, such as flasks, ampoules or the like, with at least one barrier layer, whereby, before the coating phase, i.e., before the coating gas is being introduced into the hollow body, the hollow body is heated in a heating phase using plasma, especially $O_2$ plasma, to a specified temperature. The invention also relates to a device for carrying out such a process.

Pharmaceutical packing material, such as injection flasks, ampoules or the like, can be provided on the inside with a barrier layer, such that the release of glass components and their transfer into the liquid that is in the packing agent or, in the case of plastic packaging, the penetration of foreign gases, is prevented. Very strict requirements therefore have to be imposed on the quality of such barrier layers. Since the quality of the coating in the coated product cannot be examined or can be examined only with extreme difficulty, the coating process has to be controlled, so that from the process parameters, conclusions can be drawn as to the quality of the coating.

In addition to electrical measuring methods (Langmuir probe for electron and ion properties, mass spectrometry for design and shattering of compounds in gaseous form in plasma), it is known to use optical emission spectroscopy (OES) to study the reactions that occur in a plasma and to control plasma coatings and etchings. OES has the advantage that it works in a "contactless" manner, unlike the other measuring methods, i.e., not in contact with the plasma or tie gas that is to be studied and that thus no harmful interaction with the object to be examined occurs.

"Thin Solid Films" 266 (1995) 8–13 describes that the microstructure and chemical composition of a separated film from the system $TiTP/N_2/N_2$ varies owing to the process parameters, whereby the gas composition and cathode temperature can be inferred from the optical emission of the dc voltage plasma.

In conference session 3 "10th International Symposium on Plasma Chemistry" (1991), 2.4–30, the production of $La_2O_3$ layers with low C-contamination using HF-plasma-CVD from an organic La compound and oxygen is described, and it is recommended the ratio of intensities of two lines (CO and $O_2^4$) be used to adjust the vapor pressure of the La precursor to a fixed value, so that a C content of <3% of the layer is ensured.

The book "Plasmatechnik [Plasma Technology]" by Schade, Suchanek and Tiller, published in 1990 by Verlag Technik GmbH Berlin, describes on pages 140 and 141 how the time plot of CO and AlCl emission is used, or in another example, how Si emission is used as a process control during plasma etching. In the latter case, how good or poor etching homogeneity is can be judged from the time plot of the emission line.

EP-0 299 752 indicates a process for monitoring and controlling plasma-CVD coatings. The process lies in the optical plasma emission being measured and spectrally analyzed, and the results in this regard being used to adjust plasma properties to be able to produce, in a reproducible manner, layers with specified properties. The signal that guides the adjustment is the ratio of two or more characteristic lines that are at a fixed ratio to the important plasma parameter electron temperature.

DE-38 30 622 describes a pulsed plasma-CVD process for coating the insides of quartz glass tubes. The specific emission of a layer-forming compound (SiO) is used to adjust the length and position of the plasma area in the tube, which contributes to layer formation, during coating to a specified value.

From DE 4008405 C1 a PCVD process is known for the production of a dome-shaped substrate that is provided on the inside surface and/or outside surface with a dielectric layer system, in which before coating is done, an $O_2$ gas discharge is ignited to condition the inside surface of the dome that is to be coated. The desired substrate temperature is set by the intensity and duration of the $O_2$ gas discharge. No indications are made, however, about whether and how the heating phase is monitored to ensure the desired substrate temperature.

None of the known processes, however, takes into consideration the specific requirements that are to be met in coating the insides of hollow bodies.

SUMMARY OF THE INVENTION

It is therefore an object of the invention to provide a simple process for coating hollow bodies that makes it possible to predict the property and quality of the coating even during production. It is also the object of the invention to provide an appropriate device for carrying out such a process.

Upon further study of the specification and appended claims, further objects and advantages of this invention will become apparent to those skilled in the art.

These objects are achieved by a process for CVD coating of a hollow body with a barrier layer, the improvement comprising measuring the temperature of the body by igniting plasma within said body with at least one ignition pulse and correlating the time between the ignition pulse and a pulse of light given off by plasma ignition. In particular, the invention involves a CVD process for coating the inside of a hollow body with at least one barrier layer, whereby, before a coating phase, in which coating gas is introduced into the hollow body, the hollow body is heated in a heating phase using plasma, to a specified temperature, said heating phase comprising heating by a plasma-pulse process, in which the plasma is ignited by a timed sequence of ignition pulses, and during both the heating phase and the coating phase, the time correlation of the light pulses of the plasma is measured and analyzed with the ignition pulses, as well as the intensity of at least one emission line of the coating gas. The invention further concerns a device for coating the inside of a hollow body, comprising a coating chamber, a plasma-igniting device, a gas-supply device, and an optical detecting device, wherein the plasma-igniting device (5) is designed to produce a timed sequence of ignition pulses, the optical detecting device (14) is designed to detect light pulses and emission lines of plasma, and at least plasma-igniting device (5) and optical detecting device (14) are connected to a control and analysis unit (6), which is designed to analyze the time correlation of ignition pulses and light pulses, as well as to analyze the intensity of at least one emission line. Advantageous embodiments are described in the dependent claims.

It has been shown that in the production of barrier layers, it is of decisive importance that at the beginning and during the coating process a certain specified temperature be maintained. If this temperature is too low owing to hardware errors, a barrier layer is indeed deposited, but the latter is more or less transparent to glass components, such as, e.g., sodium. In the case of diffusion barriers in plastic elements, the gas diffusion barrier action also depends on the coating temperature. It is therefore necessary to pay close attention to ensuring that after the heating phase the desired coating temperature has actually been achieved.

According to the invention, a plasma-pulse process is used in which the plasma is ignited by a timed sequence of ignition pulses, which offers the possibility of using the ignition pulses to examine at least the heating phase by analyzing the time correlation of light pulses that the plasma sends out when ignited. If no light pulses are emitted, it has to be assumed that the plasma was not ignited by the respective ignition pulse, with the consequence that in the specified heating time, which, for example, is between 10 and 20 seconds, the desired temperature is not reached. Based on such defective pulses, it can be decided as early as in the heating phase whether the subsequent coating phase should be initiated at all or not. If there is a time delay of the light pulses in comparison to the ignition pulses, this indicates also that the final temperature that is to be expected after the heating phase has not been reached. In such case, heating can be extended until the desired temperature is reached.

As additional sources of error, for example, leaky valves in the feed pipes for the coatings can be considered. It is therefore intended according to the invention that the intensity of at least one characteristic emission line of the coating gas be measured and analyzed as early as during the heating phase. If, owing to leaks in the feed pipe system, coating gas penetrates the interior of the chamber as early as during the heating phase, a correspondingly selected emission line of a gas component is more or less readily detectable. This means that as early as at a time when the desired final temperature has not yet been reached, coating takes place, with the consequence that this coating does not have the desired quality. Further, the later coating during the coating phase also can no longer cause any changes. From the strength of the intensity of such emission lines of the coating gas that occur as early as in the heating phase, the final temperature can also be deduced. If such emission lines should be present in especially pronounced form as early as during the heating phase, it has to be assumed that the desired coating temperature is also not reached at the end of the heating phase.

By the combination of monitoring the time correlation of ignition and plasma pulses as well as at least one characteristic emission line of the coating gas not only during the coating phase but as early as during the heating phase, it is possible, in a simple way, to make reliable statements as to the quality of an inside coating.

Preferably, the plasma is ignited using microwaves. The SiO line is preferably detected as an emission line where $SiO_2$ is to be deposited; however, those of skill in the art can routinely determine lines to be monitored depending on the composition of the desired coating. Useable plasmas include, e.g., $O_2$, $CF_4$, $CaF_6$, $CH_4$, $Cl_2$, $Br_2$, $NF_3$, etc., as disclosed in Plasmatechnik. Typical coatings include, e.g., SiN, $SiO_2$, AlO, $TiO_2$, BN, etc.

In the apparatus for carrying out the process, the plasma-igniting device is designed to produce a timed sequence of ignition pulses, especially microwave pulses, the optical detecting device is designed to detect light pulses and emission lines of plasma, and at least the plasma-igniting device and the optical detecting device are connected to a control and analysis unit, e.g., a computer, which is designed to analyze the time correlation of ignition pulses and light pulses as well as to analyze the intensity of at least one emission line. The defective pulses can be detected by a coincidence circuit (or a corresponding programmed compulse stage) and a delay between the ignition pulses and the light pulses is detected by time circuits (or a corresponding programmed compulser stage).

The control and analysis device is preferably also connected to at least one valve in the gas feed line to the coating chamber, e.g., in a manner so as to control entrance of the coating gas, dependent on set parameters.

According to a special embodiment, the plasma-igniting device is a microwave device.

BRIEF DESCRIPTION OF THE DRAWINGS

Exemplary embodiments are explained in more detail below based on the drawings.

Various other features and attendant advantages of the present invention will be more fully appreciated as the same becomes better understood when considered in conjunction with the accompanying drawings, in which like reference characters designate the same or similar parts throughout the several views, and wherein.

DETAILED DESCRIPTION OF THE DRAWINGS

Figure 1:
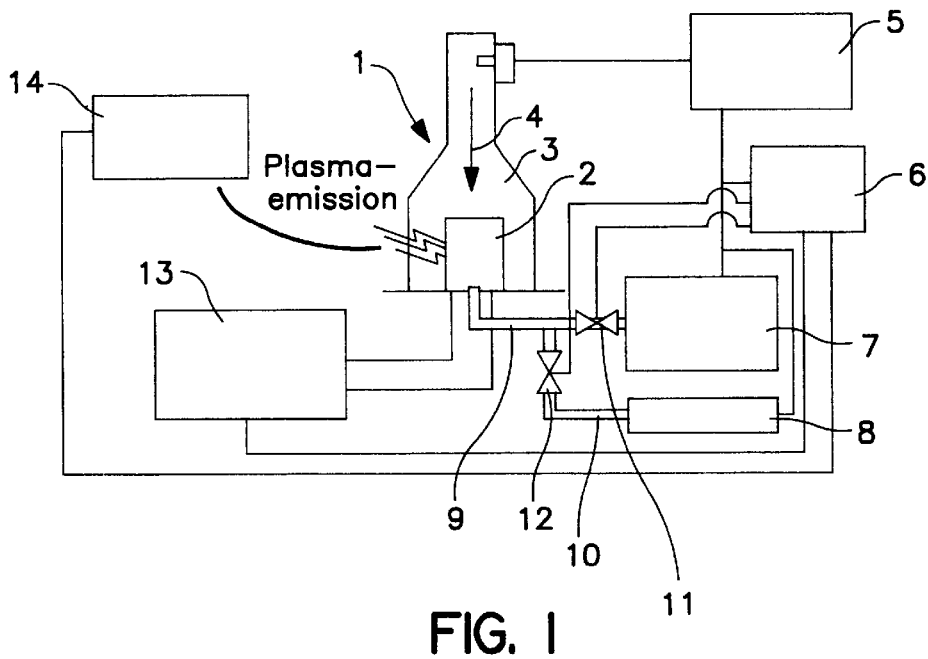
FIG. 1 shows a diagrammatic representation of the coating device.

FIG. 1 depicts a coating device (1), in which a flask (2) that is to be coated on the inside is arranged in coating chamber (3). The coating gas is introduced by a gas supply device (7) through feed line (9) from below into coating chamber (3) and thus into the interior of flask (2). Another feed line (10), which is connected to another gas supply device (8) for the supply of oxygen, is connected to feed line (9). Valves (11) and (12) are accommodated in lines (9) and (10).

A vacuum device (13) is also connected to coating chamber (3). The gas that is present in flask (2) is ignited using a microwave device (5). Microwave radiation is identified by arrow (4).

To detect the light pulses as well as one or more emission lines of the plasma, an optical detecting device (14) is provided which, like supply devices (7) and (8) and microwave device (5), is also connected to control and analysis device (6). Valves (11) and (12) as well as vacuum device (13) are also connected to control and analysis device (6).

The coating process proceeds as follows:

After flask (2) that is to be coated on the inside has been arranged in coating chamber (3), flask (2) is evacuated using vacuum device (13). Then, valve (12) on feed line (10) is opened, so that oxygen from supply device (8) can flow into the interior of flask (2). In this process, valve (11) in feed line (9) is closed. Microwave device (5) ignites the $O_2$ plasma, whereby during a specified time of 20 seconds, a sequence of ignition pulses is produced by microwave device (5). In the plasma light pulses develop that are measured by optical detecting device (14). Control and analysis device (6), which is connected to both microwave device (5) and optical detecting device (14), analyzes the time correlation of the ignition pulses to the light pulses to determine whether optionally light pulses have not been emitted or whether there is a time delay of the light pulses in comparison to the ignition pulses. If, in this connection, deviations and irregularities occur, control and analysis device (6) gives an error signal, from which it can be deduced that the desired heating of flask (2) has not occurred.

The optical detecting device is also designed to detect the intensity of an emission line of the coating gas. (Such devices are conventional in the art.) Via a corresponding lens and filter system, which is not shown in FIG. 1 and which is preferably adjusted to the wavelength of 425 nm, it is examined during the heating phase whether an emission line for the coating material, e.g., the SiO line, appears or not. If, for example, valve (11) were leaky, coating gas from supply device (7) would flow into the interior of flask (2) as early as during the heating phase. From the detection of the emission line, this leak can be detected. Also in this case, a corresponding signal is provided by optical detecting device (14) to control and analysis device (6), which then also gives an error signal.

After the heating phase has been completed and no error signal has occurred, valve (12) in feed line (10) is closed, and valve (11) in feed line (9) is opened. Then, coating gas from supply device (7) flows into the interior of flask (2), and using microwave device (5), the coating gas is then ignited in flask (2). The analysis of the light pulses and the emission line is continued during the coating process to be able to detect irregularities immediately during this phase.

Because control and analysis device (6) is also connected to valves (11) and (12) and the corresponding switch position of these valves is recorded, it is detected whether leaks optionally are present here and thus whether the coating process has not even been initiated at all or has stopped.

Figure 2:
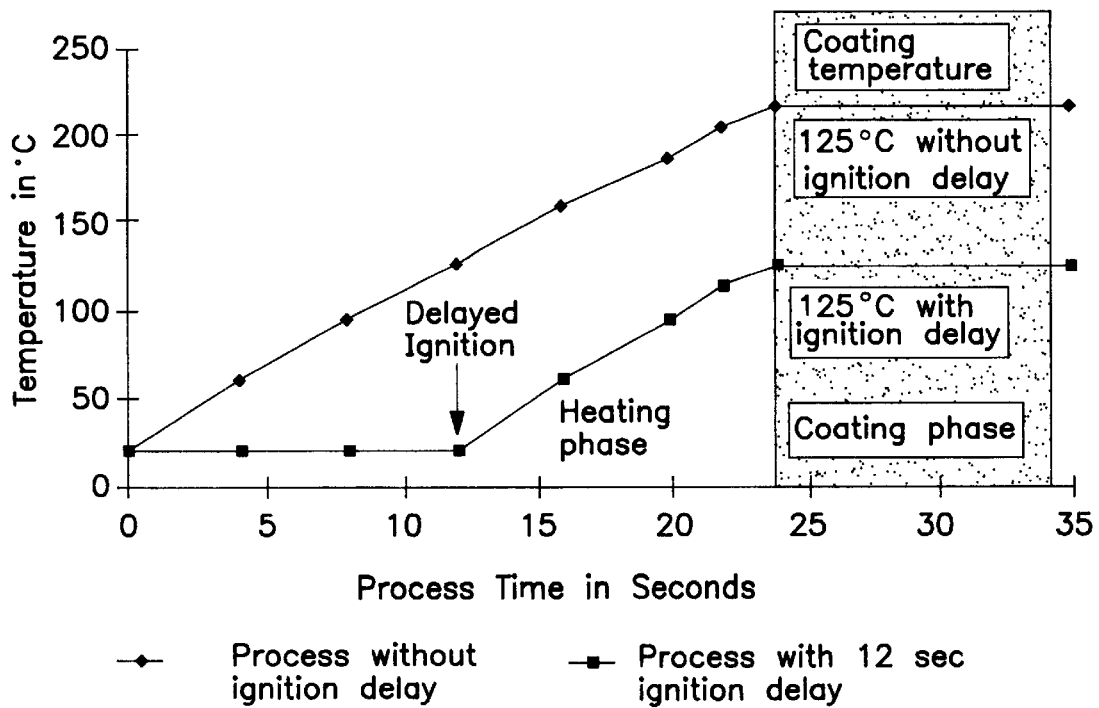
FIG. 2 shows a temperature-time diagram, which shows the influence of an incorrect $O_2$ plasma.

In FIG. 2, temperature is plotted as a function of time. At time 0, oxygen is already introduced into the interior of the flask, and the plasma is ignited using microwave pulses. As a result, the temperature of the flask increases continuously until after about 24 seconds the desired coating temperature of 215° C. has been reached. After the heating phase has been completed, the coating gas is introduced, and coating is carried out, while the coating temperature of 215° C. is maintained.

Should there be ignition delays, such that, as in FIG. 2 shown here, for example, only after 12 seconds the ignition of the O₂ plasma takes place, only a temperature of 125° C. is reached within the time remaining until the beginning of the coating phase. Control and analysis device (6) detects this delayed ignition of the plasma and provides a corresponding error signal. The heating phase must in this case then be extended for another 12 seconds, such that it is ensured that the coating temperature of 215° C. is actually reached.

Figure 3:
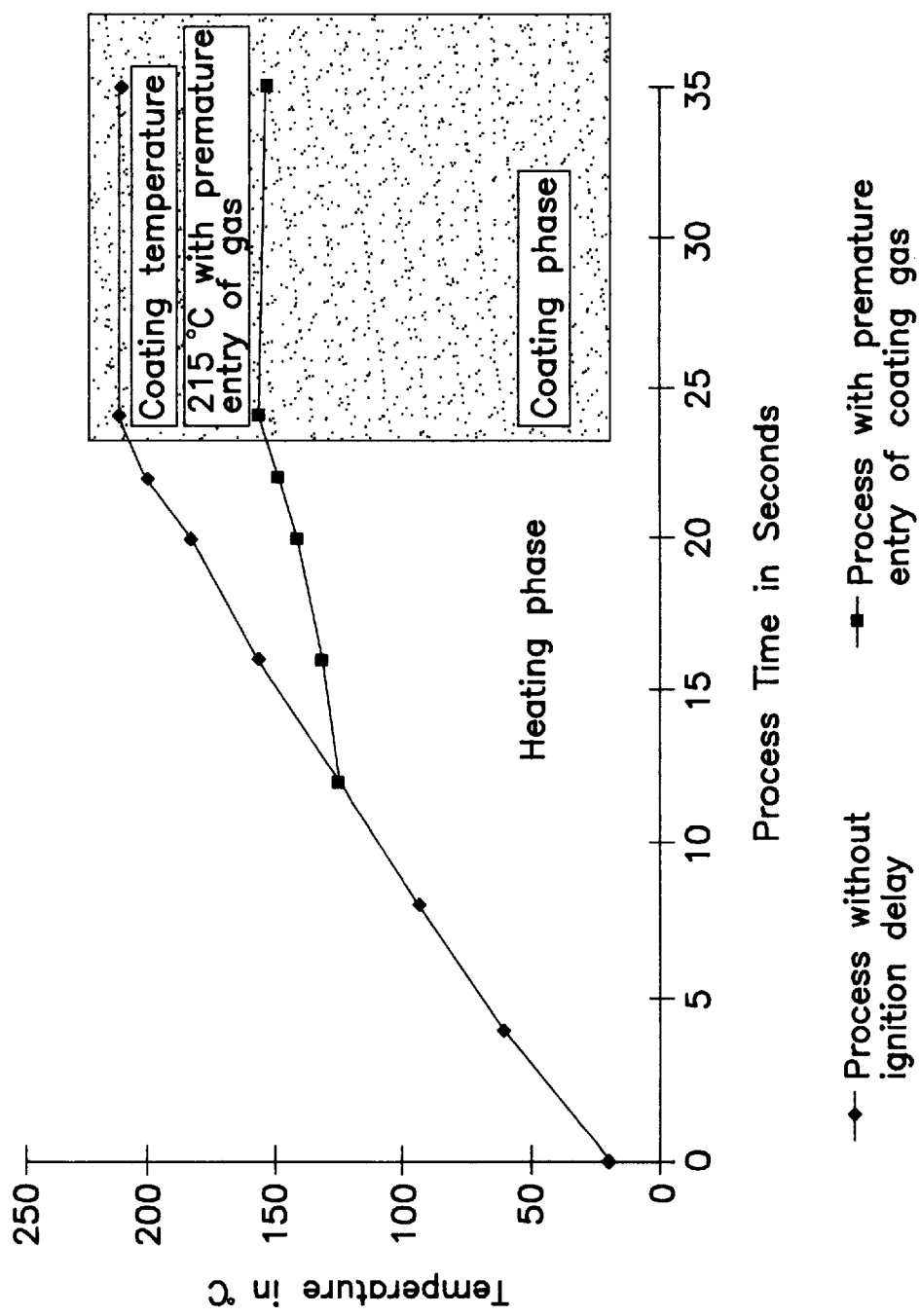
FIG. 3 shows another temperature-time diagram, which shows the influence of premature flowing-in of the coating gas.

If coating gas is introduced into the coating chamber as early as in the heating phase by leaky valves, the emission line, e.g., a SiO line, is detected. The sequence of the premature introduction of coating gas has the effect that the specified coating temperature of 215° C. is not reached. In FIG. 3, it can be seen that after approximately 13 seconds, the heating phase of this incorrect intake of coating gas occurs, so that the curve correspondingly bends and reaches a temperature of only considerably less than 215° C. after the ideal 24 seconds.

Figure 4:
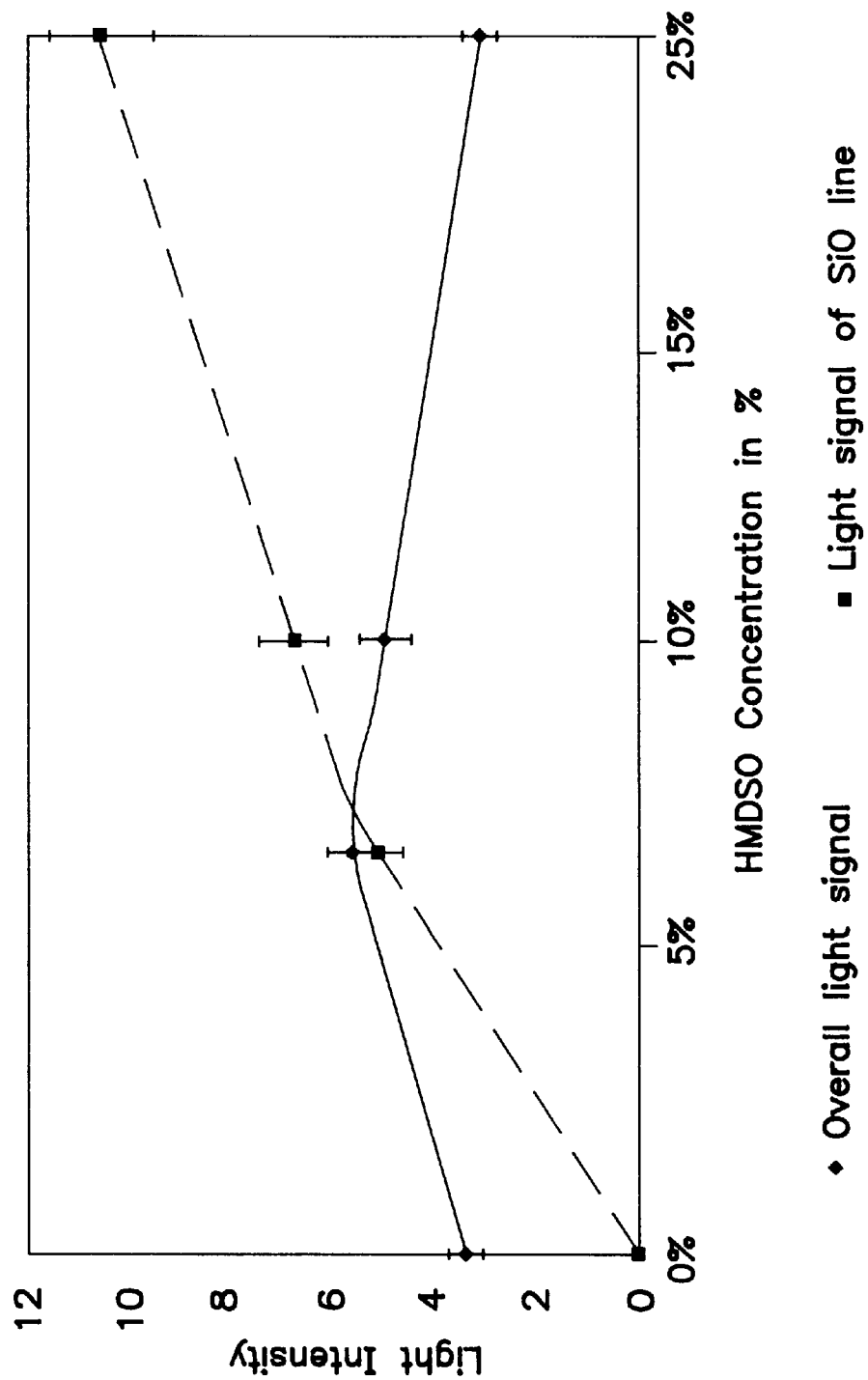
FIG. 4 shows an intensity-concentration diagram.

In FIG. 4, light intensity is plotted as a function of HMDSO (hexamethyldisiloxane, the deposition gas) concentration.

The intensity of the emission line, in this case a SiO line, indicates immediately whether the HMDSO content of the process gas, which decisively determines the quality of the separated $SiO_2$ layer, has the desired value and maintains it. This effect cannot be detected from overall intensity alone since the overall intensity first increases with increasing HMDSO intensity and then drops again.

In general: The lower the HMDSO-content during the deposition phase, the better the layer, the lighter the content, the faster the process. Therefrom there is a need for a compromise, realized by routine experiment.

Further, the HMDSO-content and temperature are linked in the process. The higher the temperature, the higher can be chosen the HMDSO-content. The effective value is chosen by routine experiment.

Figure 5:
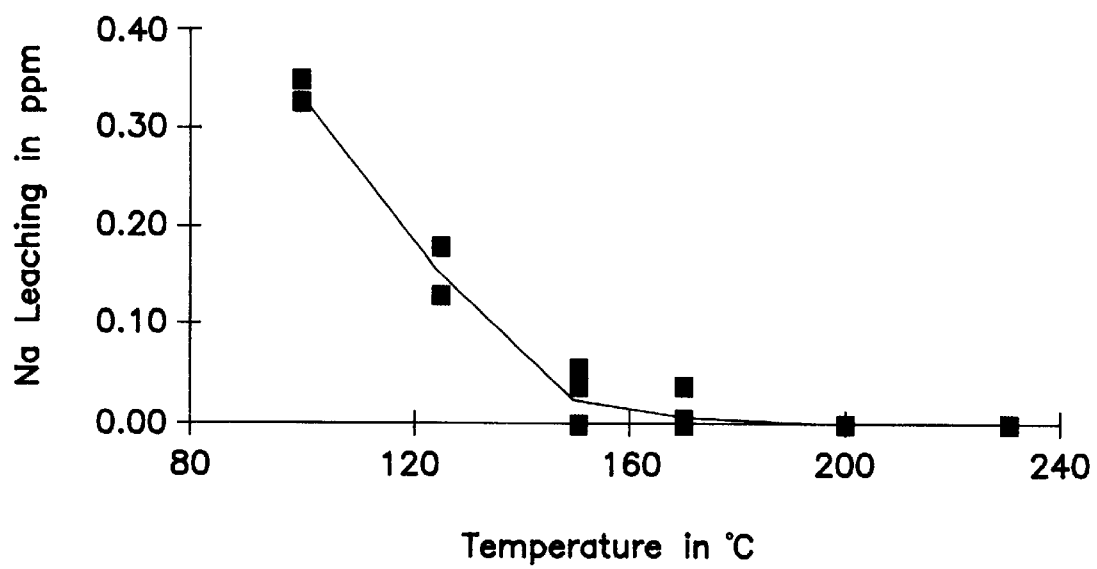
FIG. 5 shows a diagram in which the sodium content in a liquid that is present in the coated hollow body is plotted as a function of the coating temperature.

In FIG. 5, sodium leaching is plotted as a function of coating temperature. Leaching does not take place if the coating temperature is at least 200° C. For lower temperature values, such as would be set in the case of an incorrect heating phase, the coating for pharmaceutical packing material would be unsuitable.

In the foregoing, all temperatures are set forth uncorrected in degrees Celsius; and, unless otherwise indicated, all parts and percentages are by weight.

The entire disclosures of all applications, patents and publications, cited above, and of corresponding German application No. 196 29 877.6, filed Jul. 24, 1996, are hereby incorporated by reference.

The preceding can be repeated with similar success by substituting the generically or specifically described reactants and/or operating conditions of this invention for those used therein.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. In a process for CVD coating the inside of a hollow body with a barrier layer comprising igniting plasma within said body with at least one ignition pulse, the improvement comprising monitoring the temperature inside of the body by correlating the time between the ignition pulse and a pulse of light given off by plasma ignition.

2. A process according to claim 1, further comprising monitoring for a spectral emission line of a coating gas used to coat the hollow body.

3. A process according to claim 1, comprising, prior to coating of the hollow body, heating the body by igniting plasma with at least one ignition pulse, and monitoring the temperature inside the body by correlating the time between the ignition pulse and a pulse of light given off by plasma ignition during the heating phase.

4. A process according to claim 3, further comprising monitoring for a spectral emission line of a coating gas used to coat the hollow body.

5. A process according to claim 3, further comprising monitoring the temperature inside the body during coating by igniting plasma within said body with at least one ignition pulse and correlating the time between the ignition pulse and a pulse of light given off by plasma ignition.

6. A process according to claim 5, further comprising monitoring for a spectral emission line of a coating gas used to coat the hollow body during heating and coating.

7. A process according to claim 6, further comprising delaying commencement of coating until a specified temperature is reached.

8. A process according to claim 4, wherein if coating gas is detected during heating prior to coating, coating is not commenced.

9. A process according to claim 1, wherein the plasma is ignited using microwaves.

10. A process according to claim 2, wherein the emission line of SiO is monitored.

11. A process according to claim 1, wherein the hollow body is a flask or ampoule.

12. A process according to claim 1, wherein the plasma is $O_2$ plasma.

13. A CVD process for coating the inside of a hollow body with at least one barrier layer, whereby, before a coating phase, in which coating gas is introduced into the hollow body, the hollow body is heated in a heating phase using plasma, to a specified temperature, said heating phase comprising heating by a plasma-pulse process, in which the plasma is ignited by a timed sequence of ignition pulses, and during both the heating phase and the coating phase, the time correlation of the light pulses of the plasma is measured and analyzed with the ignition pulses, and the intensity of at least one emission line of the coating gas is measured.

14. A process according to claim 13, wherein the plasma is ignited using microwaves.

15. A process according to claim 13, wherein the emission line of SiO is monitored.

16. A process according to claim 13, wherein the hollow body is a flask or ampoule.

17. A process according to claim 13, wherein the plasma is $O_2$ plasma.

18. A process according to claim 13, further comprising delaying commencement of coating until a specified temperature is reached.

19. A process according to claim 13, wherein if coating gas is detected during heating prior to coating, coating is not commenced.

* * * * *